(12) United States Patent
Song et al.

(10) Patent No.: US 8,503,960 B2
(45) Date of Patent: Aug. 6, 2013

(54) AMPLIFIER AND ASSOCIATED RECEIVER

(75) Inventors: Fei Song, Singapore (SG); Chun-Geik Tan, Singapore (SG)

(73) Assignee: Mediatek Singapore PTE. Ltd., Singapore (SG)

(*) Notice: Subject to any disclaimer, the term of this patent is extended or adjusted under 35 U.S.C. 154(b) by 38 days.

(21) Appl. No.: 13/289,510

(22) Filed: Nov. 4, 2011

(65) Prior Publication Data
US 2013/0029627 A1 Jan. 31, 2013

Related U.S. Application Data

(60) Provisional application No. 61/513,134, filed on Jul. 29, 2011.

(51) Int. Cl.
*H04B 1/18* (2006.01)
*H04B 1/28* (2006.01)
*H04B 1/16* (2006.01)

(52) U.S. Cl.
USPC ........... 455/280; 455/293; 455/333; 455/341; 330/252; 330/290

(58) Field of Classification Search
USPC ................... 455/232.1–234.2, 292–293, 333, 455/341; 330/252–256, 261, 269–273, 290–291
See application file for complete search history.

(56) References Cited

U.S. PATENT DOCUMENTS

| | | | |
|---|---|---|---|
| 6,064,265 A * | 5/2000 | Yun et al. ...................... | 330/279 |
| 6,545,534 B1 | 4/2003 | Mehr | |
| 6,724,251 B1 | 4/2004 | Ziazadeh et al. | |
| 7,622,845 B2 | 11/2009 | Micko | |
| 7,657,191 B2 | 2/2010 | Killmeyer et al. | |
| 7,671,774 B2 | 3/2010 | Braswell | |
| 8,320,864 B2 * | 11/2012 | Fanous et al. .............. | 455/232.1 |
| 2005/0134385 A1 * | 6/2005 | Costa et al. ................... | 330/283 |
| 2005/0164669 A1 | 7/2005 | Molnar et al. | |
| 2006/0125557 A1 | 6/2006 | Manstretta | |
| 2006/0198176 A1 * | 9/2006 | Huang et al. .................... | 365/51 |
| 2007/0164826 A1 * | 7/2007 | Chang et al. .................. | 330/311 |
| 2007/0176664 A1 | 8/2007 | Bajdechi et al. | |
| 2007/0238431 A1 * | 10/2007 | Zhan et al. ................. | 455/232.1 |

(Continued)

FOREIGN PATENT DOCUMENTS

| | | |
|---|---|---|
| GB | 765398 | 2/1955 |
| WO | WO 2008/044750 | 4/2008 |
| WO | WO 2009/046349 | 4/2009 |

OTHER PUBLICATIONS

English language translation of abstract of WO 2008/044750 (published Apr. 17, 2008).

(Continued)

*Primary Examiner* — Simon Nguyen
(74) *Attorney, Agent, or Firm* — McClure, Qualey & Rodack, LLP

(57) ABSTRACT

An amplifier receives an input signal with an input node, provides an output signal in response, and includes a main branch and an auxiliary branch. The auxiliary branch is coupled between the input node and a splitting node for input matching of the input node. The main branch, also coupled to the splitting node, has an output node of current mode, and is arranged to output the output signal at the output node. An associated receiver is also disclosed.

21 Claims, 10 Drawing Sheets

(56) References Cited

U.S. PATENT DOCUMENTS

| | | |
|---|---|---|
| 2008/0231357 A1 | 9/2008 | Zolfaghari |
| 2009/0079499 A1* | 3/2009 | Scuteri et al. ............... 330/253 |
| 2009/0102552 A1* | 4/2009 | Shiramizu et al. ............ 330/98 |
| 2009/0191833 A1* | 7/2009 | Kaczman et al. ............. 455/296 |
| 2009/0323864 A1* | 12/2009 | Tired ........................... 375/319 |
| 2011/0063035 A1* | 3/2011 | Park et al. ..................... 330/291 |
| 2012/0154045 A1* | 6/2012 | Tsai et al. ..................... 330/253 |
| 2012/0293265 A1* | 11/2012 | Heikkinen et al. ........... 330/291 |

OTHER PUBLICATIONS

Yu, P., et al.; "A 1.2 mm2 Fully Integrated GPS Radio with Cellular/WiFi Co-Existence;" IEEE; 2010; pp. 1-4.

Orsatti, P., et al.; "A 70-MHz CMOS IF-Baseband Strip for GSM;" IEEE Journal of Solid-State Circuits; vol. 35; No. 1; Jan. 2000; pp. 104-108.

He. X., et al.; "A Compact SAW-less Multiband WCDMA/GPS Receiver Front-End with Translational Loop for Input Matching;" IEEE International Solid-State Circuits Conference; 2011; pp. 372-374.

Nakajima, T., et al.; "A Scalable Wideband Low-Noise Amplifeir Consisting of CMOS Inverter Circuits for Multi-Standard RF Receivers;" International Conference on Signals, Circuits and Systems; 2009; pp. 1-4.

Bagheri, R., et al.; "An 800-MHz-6-GHz Software-Defined Wireless Receiver in 90-nm CMOS;" IEEE Journal of Solid-State Circuits; vol. 41; No. 12; Dec. 2006; pp. 2860-2876.

Bruccoleri, F., et al.; "Noise Cancelling in Wideband CMOS LNAs;" IEEE International Solid-State Circuits Conference; 2002; pp. 1-2.

Tenbroek, B., et al.; "Single-Chip Tri-Band WCDMA/HSDPA Transceiver without External SAW Filters and with Integrated TX Power Control;" IEEE International Solid-State Circuits Conference; 2008; pp. 202, 203, & 607.

Robert, S., et al.; "Wide-Band Variable-Gain LNA in 65nm CMOS with Inverter Based Amplifier for Multi-Tuners Cable TV Reception;" IEEE; 2009; pp. 1-4.

* cited by examiner

US 8,503,960 B2

AMPLIFIER AND ASSOCIATED RECEIVER

This application claims the benefit of U.S. provisional patent application No. 61/513,134, filed Jul. 29, 2011, the subject matter of which is incorporated herein by reference.

FIELD OF THE INVENTION

The present invention relates to amplifier and associated receiver, and more particularly to amplifier and associated receiver arranged to implement RF (Radio Frequency) wireless receiving front-end with current mode interfaces.

BACKGROUND OF THE INVENTION

Wireless networks and systems, such as wireless communication, broadcasting and satellite positioning systems, have been broadly utilized in modern society. Wireless systems are implemented with receivers which receive and process wireless signals. The receiver includes circuitry RF front-end as a portion of physical layer of networking. The RF front-end receives wireless signal as electric (e.g., current and/or voltage) analog RF signal, amplifies the RF signal and down-converts the amplified RF signal to IF (Intermediate Frequency) signals and/or baseband signals for further signal process, e.g., low-pass filtering, analog-to-digital converting, decoding, de-scrambling, demodulation, and/or inverse constellation mapping, etc. Thus, information, messages, data and commands carried in the wireless signal can be retrieved.

SUMMARY OF THE INVENTION

An embodiment of the invention is providing an amplifier receiving an input signal and providing an output signal in response; the amplifier includes a gain stage, a main branch, an auxiliary branch and a feedback circuit. The gain stage includes an input node and a splitting node, wherein the input node is coupled to the input signal. The main branch includes a first node and an output node of current mode; the first node is coupled to the splitting node, and the main branch is arranged to output the output signal at the output node. The auxiliary branch includes a second node and a feedback node, and the second node is coupled to the splitting node. The feedback circuit is coupled between the feedback node and the input node.

In an embodiment, the voltage swing at the output node is much less than the voltage swing at the feedback node, and the embodiment implements a current mode interface of high linearity with a smaller voltage gain from the input node to the output node. On the other hand, the auxiliary branch provides a relatively larger voltage gain from the input node to the feedback node, such that the auxiliary branch can realize impedance matching at the input node with the feedback circuit.

In an embodiment, for implementing a current mode interface between the amplifier and a next-stage circuit (e.g., a mixer for down-converting), the main branch of the receiver is arranged to provide an output impedance at the output node and conduct a current with a load impedance of the next-stage circuit, wherein the output impedance is larger than the load impedance.

The receiver embeds a noise cancelling functionality. The auxiliary branch is arranged to provide a voltage fluctuation at the input node in response to a first current fluctuation to the splitting node, and the gain stage is arranged to drive a second current fluctuation to the splitting node in response to the voltage fluctuation, wherein the second current fluctuation is out-of-phase with the first current fluctuation.

In an embodiment, the amplifier further includes a bridge circuit coupled between the output node and the feedback node for blocking an AC (alternating current) signal at the feedback node away from the output node, and coupling a DC (direct current) bias at the feedback node to the output node. The bridge circuit is arranged to provide a first resistance between the feedback node and the output node, the feedback circuit is arranged to provide a second resistance between the input node and the feedback node, and the first resistance is greater than the second resistance. Large voltage swing at the feedback node is greatly attenuated to a relatively smaller voltage swing at the output node, and almost no linearity degradation for the main branch.

In an embodiment, the gain stage includes a first transistor with a first gate, a first drain and a first source respectively coupled to the input node, the splitting node and a supply voltage. The auxiliary branch includes a second transistor with a second gate, a second drain and a second source respectively coupled to a second bias voltage, the feedback node and the second node. The main branch includes a third transistor with a third gate, a third drain and a third source respectively coupled to a first bias voltage, the output node and the splitting node. In an embodiment, an aspect ratio (e.g., a ratio of a channel width to a channel length) of the third transistor is greater than an aspect ratio of the second transistor.

In an embodiment, the first bias voltage and the second bias voltage are in association with a current dependent on temperature, e.g., a PTAT current which is Proportional To Absolute Temperature.

In an embodiment, the amplifier also includes a first predetermined number of tuning branches. Each of the tuning branches has a third node and a tuning output node of current mode. The third node of each tuning branch is commonly coupled to the splitting mode, and each of the tuning branches can be selectively enabled to provide a tuned output signal at the corresponding tuning output node in response to the input signal. In an embodiment, the amplifier also includes a second predetermined number of tuning bridge circuits; each tuning bridge circuit is coupled between two tuning output nodes of the corresponding tuning branches. In an embodiment, the feedback circuit is arranged to provide a resistance between the feedback node and the input node, and the resistance is variable in response to a number of the enabled tuning branches.

Another embodiment of the invention is providing a receiver, which includes an amplifier, a mixer and a secondary amplifier. The amplifier is arranged to receive an input signal with an input node and provide an output signal in response. The amplifier includes a main branch and an auxiliary branch. The main branch has an output node of current mode, and is arranged to output the output signal at the output node. The auxiliary branch is coupled to the input node for impedance matching of the input node; wherein the main branch and the auxiliary branch are further coupled to a splitting node. The mixer is coupled to the amplifier, and is arranged to mix the output signal with a carrier signal to provide a mixed signal. The secondary amplifier is coupled to the mixer through a current mode interface, and is arranged to provide an internal signal in response to the mixed signal.

In an embodiment, the amplifier further includes a gain stage and a feedback circuit. The gain stage includes a first transistor with a first gate, a first drain and a first source respectively coupled to the input node, the splitting node and a supply voltage. The feedback circuit is coupled between the auxiliary branch and the input node.

In an embodiment, the main branch and the auxiliary branch respectively operate according to a first bias voltage and a second bias voltage, and the receiver further includes a bias circuit arranged to provide the first bias voltage and the second bias voltage in response to a current dependent on temperature.

In an embodiment, the amplifier further includes a first predetermined number of tuning branches. Each of the tuning branches has a third node and a tuning output node of current mode, the third node is coupled to the splitting mode, and each of the tuning branches can be selectively enabled to provide a tuned output signal at the corresponding tuning output node in response to the input signal. The mixer is arranged to mix the tuned output signal of one of the tuning bridges with a carrier signal to provide the mixed signal. In an embodiment, the amplifier further includes a second predetermined number of tuning bridge circuits, each tuning bridge circuit is coupled between two tuning output nodes of the corresponding tuning branches. In an embodiment, the feedback circuit is arranged to provide a resistance between the feedback node and the input node, and the resistance is variable in response to a number of the enabled tuning branches.

In an embodiment, the receiver includes a plurality of amplifiers. The input nodes of the amplifiers are commonly coupled together, and the output nodes of the amplifiers are commonly coupled together; each of the amplifiers can be selectively enabled and disabled. In an embodiment, the feedback circuit of each of the amplifiers is arranged to provide a resistance between the feedback node and the input node, and the resistance is variable in response to a number of enabled amplifiers.

In an embodiment, the secondary amplifier comprising a variable resistor coupled between a node of the current mode interface and a node providing the internal signal for adjusting a gain between the input signal and the internal signal.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
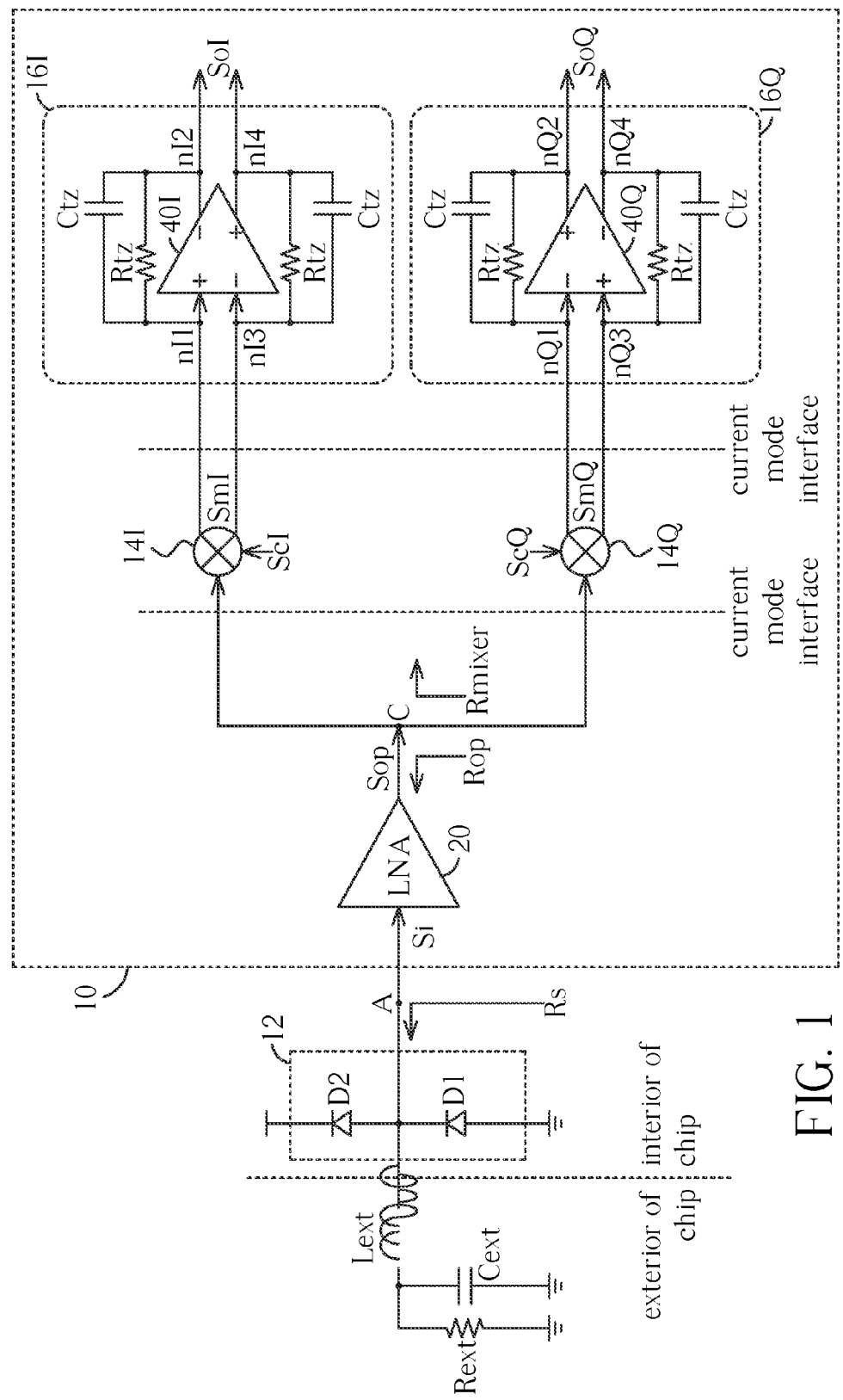
FIG. 1 illustrates a receiver and associated peripheral circuits according to an embodiment of the invention.

Please refer to FIG. 1 illustrating a receiver 10 in cooperation with other peripheral circuits according to an embodiment of the invention. The receiver 10 implements an RF front-end with an amplifier 20, two mixers 14I and 14Q, and two secondary amplifiers 16I and 16Q. In an embodiment, the receiver 10 is integrated in a chip, while external receiving peripheral circuits exterior to the ship, such as antenna for receiving wireless signal, transmission lines for relaying received signals, external inductor(s), external SAW (Surface Acoustic Wave) element and/or external amplifier, are modeled by a resistor Rext, an inductor Lext and a capacitor Cext. The resistor Rext, the inductor Lext and the capacitor Cext are coupled to a node A through a protection circuit 12, e.g., an ESD (Electro-Static Discharge) circuit including two diodes D1 and D2. Thus, signal of the node A is fed into the receiver 10 as an input signal Si, and an impedance outward from the node A can be modeled by a resistor Rs.

In the receiver 10, the amplifier 20 functions as a Low-Noise Amplifier (LNA) for receiving the input signal Si with the node A and providing an output signal Sop at a node C in response. To support a current mode interface between the amplifier 20 and the mixers 14I and 14Q, the node C of the amplifier 20 is an output node of current mode. The mixers 14I and 14Q are coupled to the amplifier 20 at the node C, and are arranged to mix the output signal Sop with carrier signals ScI and ScQ to provide mixed signals SmI and SmQ, respectively. In an embodiment, the carrier signals ScI and ScQ are of a same frequency with a mutual phase difference of ninety degrees, so the signal Sop is down-converted to the mixed signals SmI and SmQ of IF or baseband.

In association with frequency bands of the mixed signals SmI and SmQ, the secondary amplifiers 16I and 16Q work as IF or baseband amplifiers. The secondary amplifier 16I includes an amplifier core 40I, two resistors Rtz and two capacitors Ctz. The amplifier core 40I has an input port of nodes nI1 and nI3, and an output port of nodes nI2 and nI4. One of the two resistors/capactitors Rtz/Ctz is coupled between the nodes nI1 and nI2, and the other is coupled between the nodes nI3 and nI4. Similarly, the secondary amplifier 16Q includes an amplifier core 40Q, two resistors Rtz and two capacitors Ctz. The amplifier core 40Q has an input port of nodes nQ1 and nQ3, and an output port of nodes nQ2 and nQ4. One of the two resistors/capactitors Rtz/Ctz is coupled between the nodes nQ1 and nQ2, and the other is coupled between the nodes nQ3 and nQ4.

The secondary amplifiers 16I and 16Q are respectively coupled to the mixers 14I and 14Q through a current mode interface of the nodes nI1, nI3, nQ1 and nQ3, and are arranged to provide the internal signals SoI and SoQ, amplified in response to the mixed signals SmI and SmQ, at the output ports of the amplifiers cores 40I and 40Q, respectively. Thus, the internal signal SoI and SoQ can be further processed to retrieve information carried in the signal Si.

The receiver 10 implements a current mode RF chain, as current mode interfaces are adopted between the amplifier 20 and mixers 14I/14Q, and between the mixers 14I/14Q and the secondary amplifiers 16I/16Q. Generally, for a first circuit interfacing a second circuit with a current mode interface, the first circuit acts as a current source with a high output impedance, and the second circuit has a relative low input impedance shunt with the output impedance of the first circuit, such that the second circuit can drain majority of current provided by the first circuit. For example, to support the current interface between the amplifier 20 and the mixers 14I and 14Q, the amplifier 20 provides a greater output impedance Rop at the node C and conducts current of the output signal Sop with a relatively lower load impedance Rmixer of the mixers 14I and 14Q.

Figure 2:
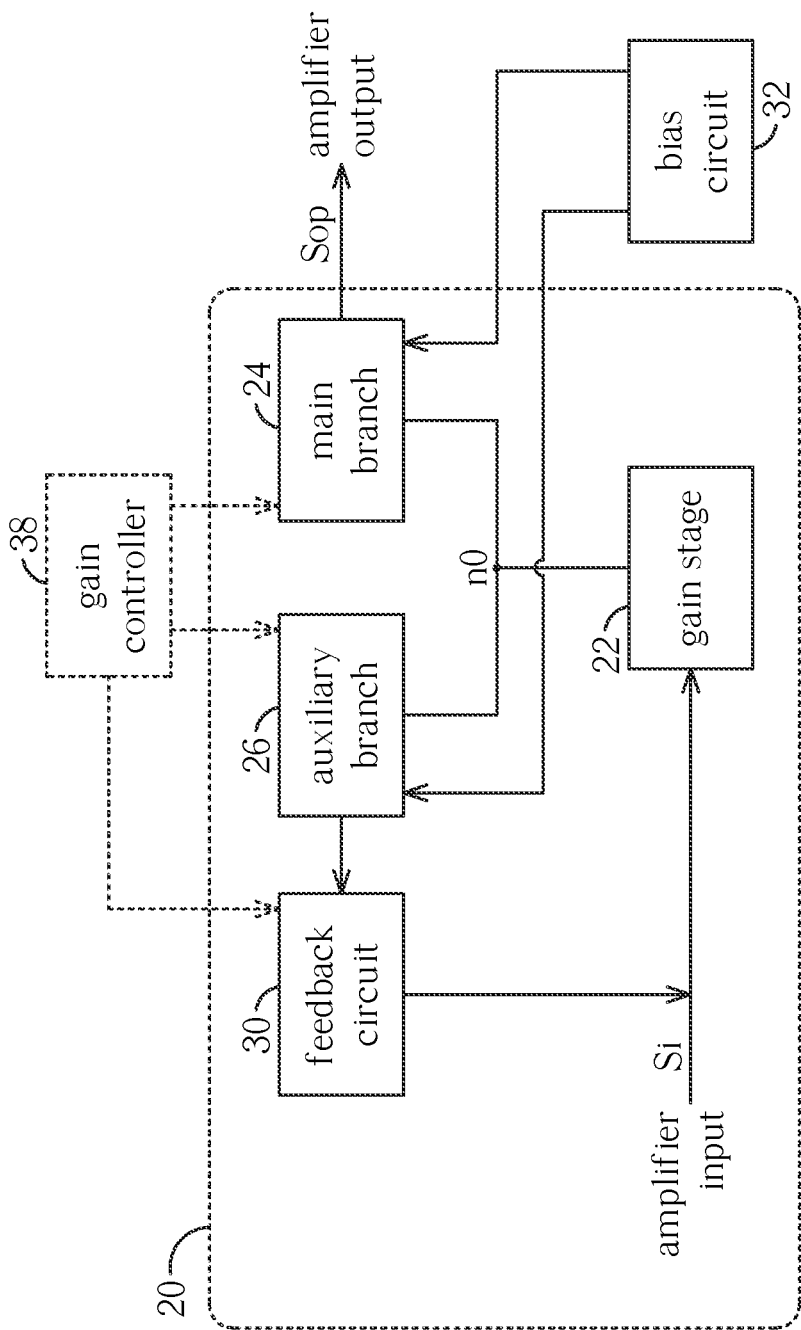
FIG. 2 illustrates a block diagram of the amplifier in FIG. 1 according to an embodiment of the invention.

As a start point of the RF chain, the amplifier 20 establishes input matching of the node A for matching the resistor Rs, and supports current mode interface at the node C. Please refer to FIG. 2 illustrating a block diagram of the amplifier 20 in association with supporting peripheral circuits. The amplifier 20 includes a gain stage 22, a main branch 24, an auxiliary branch 26 and a feedback circuit 30. The main branch 24 is arranged to support current mode interface for outputting the output signal Sop; and the auxiliary branch 26, with the feedback circuit 30, is arranged to achieve input matching for receiving the input signal Si. The main branch 24 and the auxiliary branch 26 are commonly coupled to the gain stage 22 at a splitting node n0; wherein the gain stage 22 is arranged to provide a gain (e.g., a trans-conductance gain) and drive a current at the node n0 in response to the input signal Si, so the main branch 24 can conduct a corresponding current of the signal Sop.

The bias circuit 32 is coupled to the main branch 24 and the auxiliary branch 26 for providing necessary bias. An optional gain controller 38 can also be included as a peripheral circuit for controlling the gain from the input signal Si to the output signal Sop if the amplifier 20 (and the receiver 10) is arranged to support variable gain.

Figure 3:
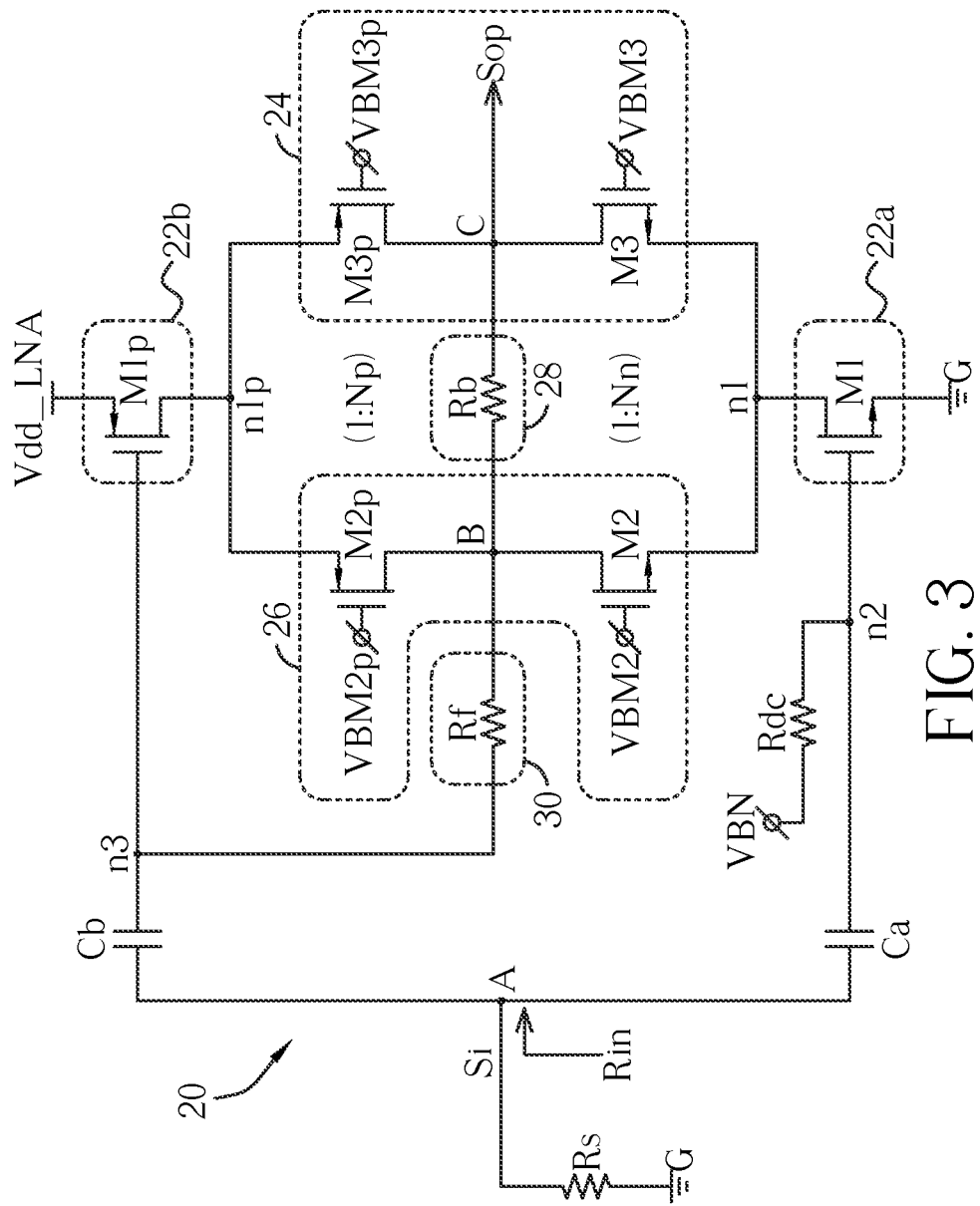
FIG. 3 illustrates a circuit architecture of the amplifier in FIG. 1 according to an embodiment of the invention.

Please refer to FIG. 3 which illustrates a circuit architecture to implement the amplifier 20 of FIG. 2 according to an embodiment of the invention. The amplifier 20 of FIG. 3 operates between two supply voltages Vdd_LNA and G (e.g., a ground), receives the input signal Si and provides the output signal Sop in response. The amplifier 20 includes gain stages 22a and 22b, a main branch 24, an auxiliary branch 26, a bridge circuit 28 and a feedback circuit 30. The node A works as a common input node of the gain stages 22a and 22b, and the gain stages 22a and 22b respectively includes nodes n1 and n1p as two splitting nodes. The main branch 24 is coupled to the nodes n1 and n1p, and is arranged to output the output signal Sop at the node C which is a current mode output node. The auxiliary branch 26 is also coupled between the node n1 and n1p, with a node B as a feedback node. The feedback circuit 30 is coupled between the nodes A and B. The bridge circuit 28 is coupled between the nodes C and B.

As shown in the embodiment of FIG. 3, the node A is coupled to the nodes n2 and n3 respectively through two capacitors Ca and Cb of AC coupling. The gain stage 22a includes a transistor M1 with a gate, a drain and a source respectively coupled to the node n2, the node n1 and the supply voltage G; a bias voltage VBN, e.g., a DC bias voltage, is also coupled to the node n2 through a resistor Rdc for establishing DC bias of the node n2. The gain stage 22b includes a transistor M1p with a gate, a drain and a source respectively coupled to the node n3, the node n1p and the supply voltage Vdd_LNA. The transistors M1 can be an n-channel MOSFET (Metal-Oxide-Semiconductor Field Effect Transistor), and the transistors M1p can be a complementary p-channel MOSFET.

The auxiliary branch 26 includes a transistor M2 (e.g., an n-channel MOSFET) and a transistor M2p (e.g., a complementary p-channel MOSFET). The transistor M2 has a gate, a drain and a source respectively coupled to a bias voltage VBM2, the node B and the node n1; and the transistor M2p has a gate, a drain and a source respectively coupled to a bias voltage VBM2p, the node B and the node n1p. The main branch 24 includes a transistor M3 (e.g., an n-channel MOSFET) and a complementary transistor M3p (e.g., a p-channel MOSFET). The transistor M3 has a gate, a drain and a source respectively coupled to a bias voltage VBM3, the node C and the node n1, and the transistor M3p has a gate, a drain and a source respectively coupled to a bias voltage VBM3p, the node C and the node n1p. A comparison between aspect ratios of the transistor M3p and M2p can be represented by (1:Np), and a comparison between aspect ratios of the transistor M3 and M2 can be represented by (1:Nn). The quantities Nn and Np can be the same or different; in an embodiment, they are set to be greater than 1. With the quantities set to be larger than 1, a majority portion of current conducted by the transistors M1 and M1p will flow along source-drain channels of the transistors M3p and M3, and a relatively minority portion of current conducted by the transistors M1 and M1p will be left to flow along source-drain channels of the transistors M2p and M2.

The bridge circuit 28 is arranged to provide a first resistance by a resistor Rb between the nodes B and C, and the feedback circuit is arranged to provide a second resistance by a resistor Rf between the nodes n3 and B.

Through the transistors M1p, M3p, M3 and M1, the amplifier 20 adopts a push-pull cascode topology for amplifying the input signal Si to the output signal Sop. Through AC coupling of capacitors Ca and Cb, voltage of the input signal Si transmits from the node A to nodes n2 and n3 of the gain stages 22a and 22b, so the transistors M1 and M1p respectively drive currents at the nodes n1 and n1p in response to the input signal Si. The transistors M3 and M3p respectively conduct current at the node C in response to currents at the nodes n1 and n1p, and thus current of the output signal Sop is outputted at the node C.

The topology of the transistors M1p, M3p, M3 and M1 can be designed to provide a smaller voltage gain (e.g., a voltage gain approximated to 0) from the input signal Si to the output signal Sop, thus a current mode interface with high (current) linearity is achieved at the node C. For the amplifier 20 shown in FIG. 3, an overall trans-conductance Gm from voltage of the input signal Si to current of the output signal Sop can be approximated by $2*gm3*(gm1p+gm1)/(gm2+2*gm3)$, where quantities gm1p, gm1, gm2 and gm3 are respectively (small signal) trans-conductance of the transistors M1p, M1, M2 and M3.

While the topology of the transistors M1p, M3p, M3 and M1 is arranged to support current mode interface at the node C, another topology of the transistors M1p, M2p, M2 and M1 is arranged for input matching at the node A, such that an impedance Rin at the node A matches the resistor Rs. The topology of the transistors M1p, M2p, M2 and M1 is designed to provide a relatively larger voltage gain from the node A to the node B, so the impedance Rin at the node A is dominated by the resistor Rf, and input matching can thus be controlled by the resistor Rf. That is, a voltage swing at the node C is much less than a voltage swing at the node B, and therefore potentially contradictory requirements of providing high linearity output trans-conductance and providing high voltage gain for input matching are both satisfied by the main branch 24 and the auxiliary branch 26, respectively. The impedance Rin of the amplifier 20 in FIG. 3 can be approximated by $Rf/((gm2p+gm2)*ro)$, where quantity gm2p is (small signal) trans-conductance of the transistors M2p, and quantity ro is an equivalent resistance between the source and the drain of the transistor M2.

The resistor Rb of the bridge circuit 28 is arranged to block AC signal at the node B away from the node C, and couple a DC bias at the node B to the node C. As a voltage swing Vb_swing at the node B is (approximately) reflected to a voltage swing Vb_swing*Rmixer/(Rmixer+Rb) at the node C, the resistance of the resistor Rb is set to be much greater than that of the load impedance Rmixer (FIG. 1). Thus, large voltage swing at the node B (due to high voltage gain) is equivalently kept isolated from affecting voltage swing at the node C, while DC bias at the node B can still be used to facilitate DC bias at the node C. In an embodiment, the resistance of the resistor Rb is further set greater than that of the resistor Rf. In an embodiment, the bridge circuit 28 can be omitted, so the nodes B and C are isolated by open. Larger resistance of the resistor Rf is also beneficial to reduce noise of the RF chain.

Figure 4:
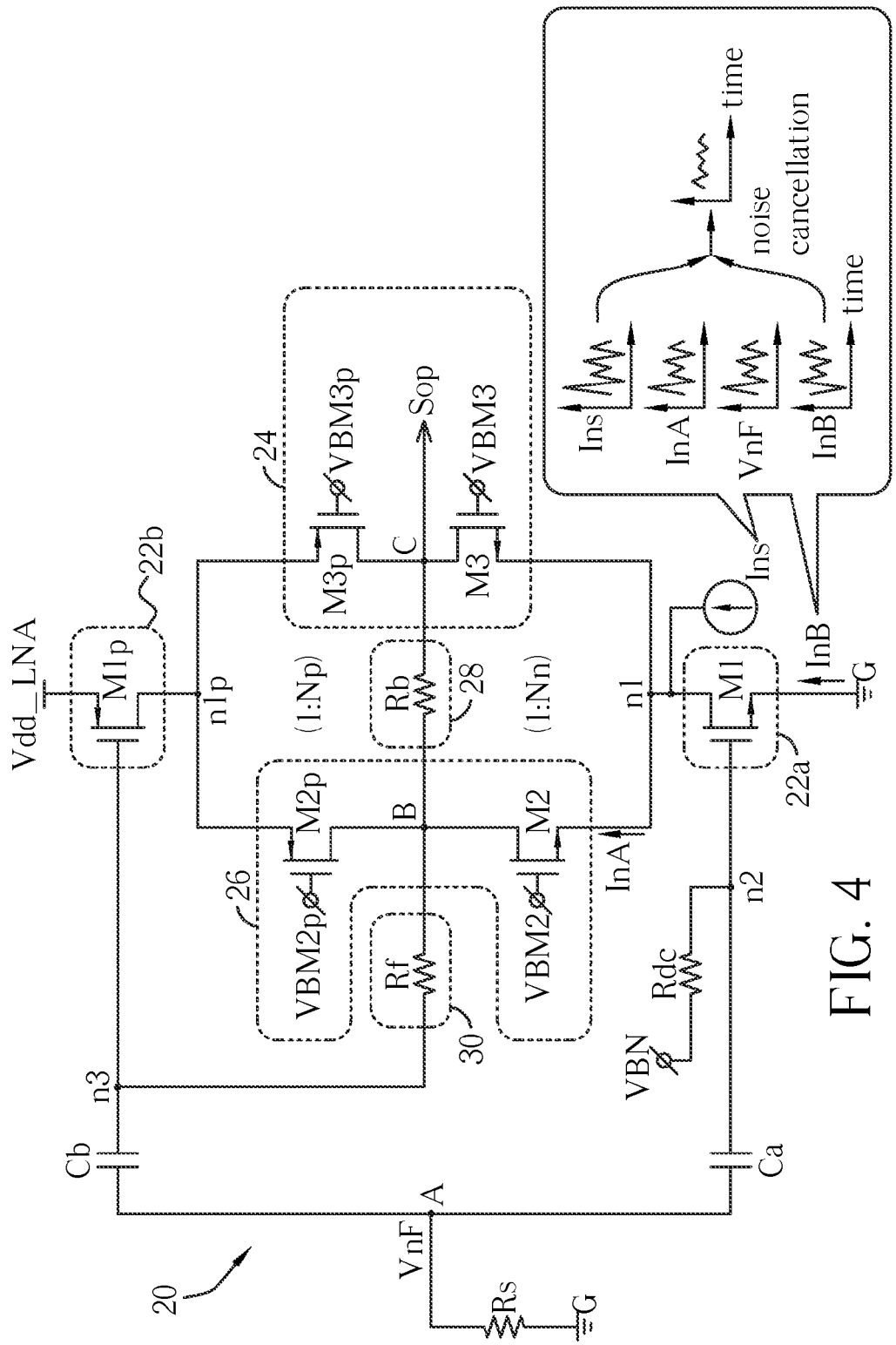
FIG. 4 illustrates noise cancellation of the amplifier in FIG. 3 according to an embodiment of the invention.

As the topology of the transistors M1p, M3p, M3 and M1 shares the transistors M1p and M1 with the topology of the transistors M1p, M2p, M2 and M1, the amplifier 20 benefits from current reuse. In addition, shared transistors M1p and M1 also implement an embedded noise cancellation effect; please refer to FIG. 4 illustrating noise cancellation of the amplifier 20. In FIG. 4, noise induced by the transistor M1 is modeled by a noise current source providing a current fluctuation Ins injected into the node n1, and a portion of the current fluctuation Ins becomes a current fluctuation InA through the transistor M2. A portion of the current fluctuation InA flows through the resistor Rf, and causes a voltage fluctuation VnF at the node A. Equivalently, with the feedback circuit 30, the auxiliary branch 26 is arranged to provide the voltage fluctuation VnF at the node A in response to the current fluctuation Ins to the node n1, and the gain stage 22a is arranged to drive a current fluctuation InB to the node n1 in response to the voltage fluctuation VnF, wherein the current fluctuation InB is out-of-phase with the current fluctuation Ins.

As an example, for the current fluctuation Ins with a positive magnitude injected into the node n1 to increase current toward the node n1, a voltage fluctuation at the node B rises with a positive magnitude, and thus the voltage fluctuation VnF also rises with a positive magnitude. As the voltage fluctuation VnF is coupled to the gate of the transistor M1, the transistor M1 drains more current from the node n1, and thus tendency increasing current to the node n1 is cancelled. That is, the increasing voltage fluctuation VnF causes a current fluctuation leaving the node n1 with a positive magnitude; equivalently, the current fluctuation InB flows toward the node n1 with a negative magnitude, and therefore suppresses current increasing tendency owing to the current fluctuation Ins. As noisy current fluctuation is suppressed at the node n1, current conducted by the transistor M3 is less sensitive to noise of the transistor M1.

Figure 5:
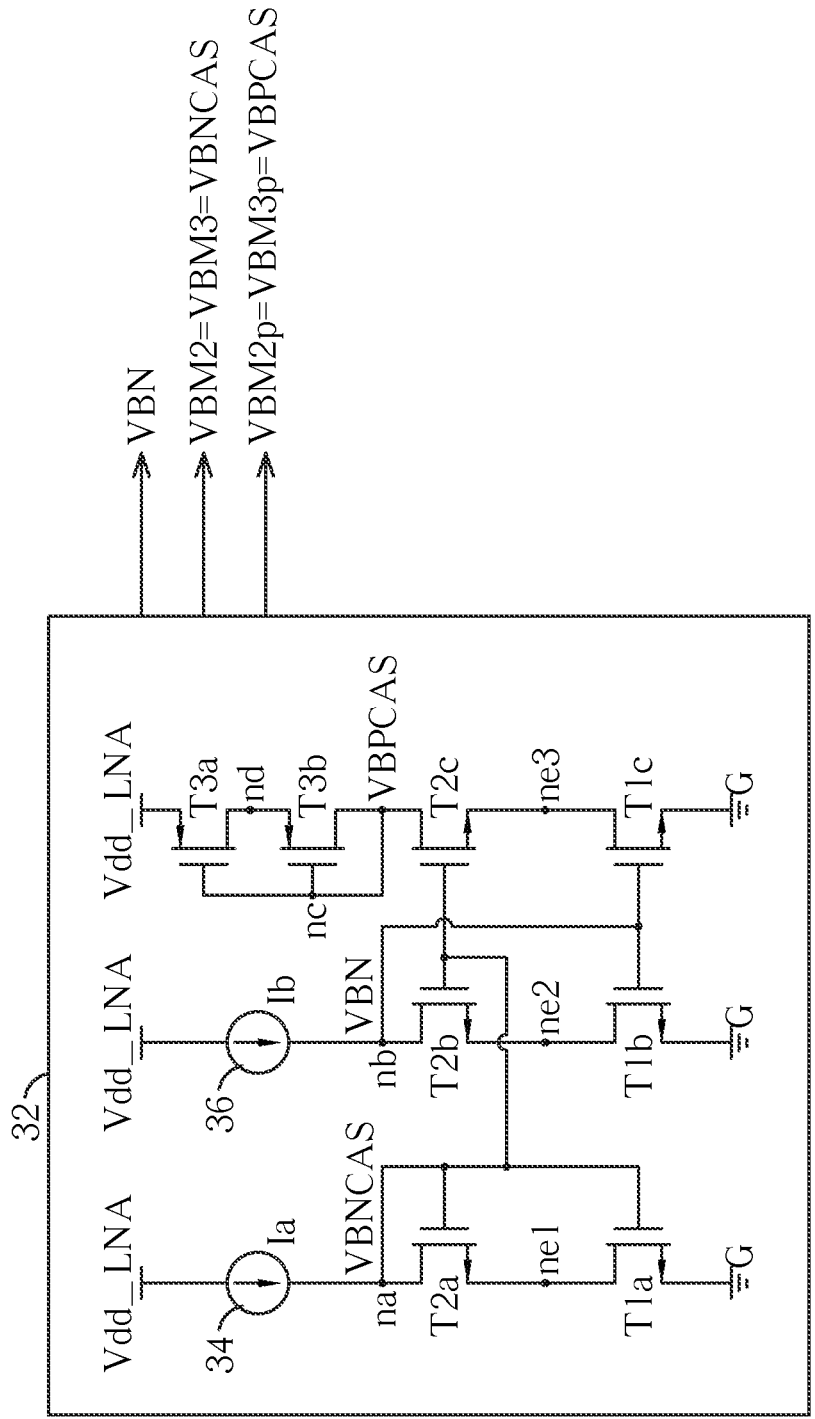
FIG. 5 illustrates a circuit architecture of the bias circuit in FIG. 2 according to an embodiment of the invention.

Please refer to FIG. 5 illustrating a circuit architecture of the bias circuit 32 according to an embodiment of the invention. The bias circuit 32 is arranged to provide the bias voltages VBN, VBM2, VBM3, VBM2p and VBM3p for the amplifier 20 of FIG. 3. The bias circuit 32 operates between the supply voltages Vdd_LNA and G, and includes transistors (e.g., n-channel MOSFET) T1a, T1b, T1c, T2a, T2b, T2c, as well as transistors (e.g., p-channel MOSFET) T3a and T3b, and two current sources 34 and 36.

In the bias circuit 32, gates of the transistors T1a, T2a, T2b and T2c and a drain of the transistor T2a are commonly coupled to a node na, gates of the transistors T1b and T1c and a drain of the transistor T2b are coupled to a node nb; gates of the transistors T3a and T3b and drains of the transistors T2c and T3b are commonly coupled to a node nc. A source and a drain of the transistor T3a are respectively coupled to the supply voltage Vdd_LNA and a node nd, and a source of the transistor T3b is coupled to the node nd. A drain and a source of the transistor T1a are respectively coupled to a node ne1 and the supply voltage G, and a source of the transistor T2a is coupled to the node ne1. A drain and a source of the transistor T1b are respectively coupled to a node ne2 and the supply voltage G, and a source of the transistor T2b is coupled to the node ne2. A drain and a source of the transistor T1c are respectively coupled to a node ne3 and the supply voltage G, and a source of the transistor T2c is coupled to the node ne3.

The current source 34 is coupled between the supply voltage Vdd_LNA and the node na, and provides a current Ia to the node na. The current source 36 is coupled between the supply voltage Vdd_LNA and the node nb, and provides a current Ib to the node nb. In an embodiment, the bias voltages VBM2 and VBM3 are the same as a voltage VBNCAS provided at the node na; the bias voltages VBM2p and VBM3p are equal to a voltage VBPCAS provided at the node nc. The bias voltage VBN is provided at the node nb.

As impedance Rin of the amplifier 20 in FIG. 3 can be approximated by Rf/((gm2p+gm2)*ro), input matching at the node A is robust against process variation (e.g., process corners where extreme process variations happen). For example, on FF corner, the trans-conductance gm2 (and gm2p) becomes larger, but the resistance ro tends to become smaller. On SS corner, the trans-conductance gm2 (and gm2p) is smaller, but the resistance ro tends to be larger. Thus, product (gm2p+gm2)*ro shows relatively smaller variation against process variations, and input matching of the amplifier 20 is robust.

For temperature variation, the currents Ia and Ib can be PTAT currents, so the trans-conductance gm2 (and gm2p) is compensated against temperature variation. For example, when temperature rises, carrier mobility of the transistors decreases and the trans-conductance tends to become smaller. However, as the currents Ia and Ib also increase with temperature, the bias voltages VBM2 and VBM3 become higher to provide a tendency of increasing the trans-conductance, such that the trans-conductance can be maintained against temperature variation. The current Ia and Ib can be mirrored from a bandgap circuit (not shown), which provides a PTAT current by, e.g., generating a PTAT voltage across a resistor.

Figure 6:
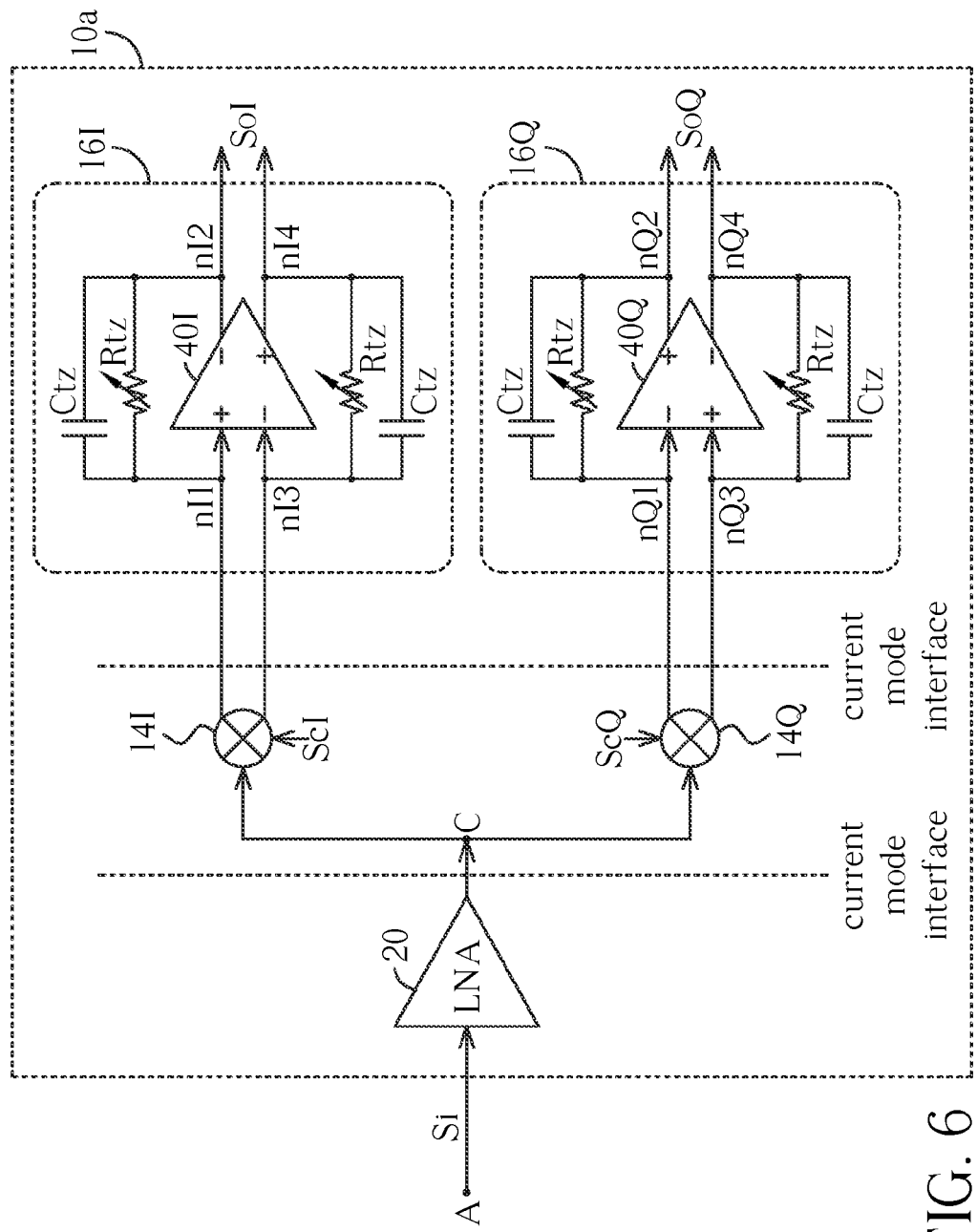
FIG. 6 illustrates a receiver according to an embodiment of the invention.

Please refer to FIG. 6 illustrating a receiver 10a according to an embodiment of the invention. Architecture of the receiver 10a is similar to that of the receiver 10 shown in FIG. 1, while the receiver 10a is arranged to provide adjustable gain from the input signal Si to the internal signals SoI and SoQ. Similar to the receiver 10 of FIG. 1, the receiver 10a of FIG. 6 includes the amplifier 20, the two mixers 14I and 14Q, and the two secondary amplifier 16I and 16Q. For adjustable gain, variable resistors Rtz are adopted in the secondary amplifier 16I, so the gain between the input signal SI and the internal signal SoI can be adjusted by changing resistance of the resistors Rtz. Similarly, in the secondary amplifier 16Q, variable resistors Rtz are utilized between the nodes nQ1 and nQ2 as well as the nodes nQ3 and nQ4, such that the gain from the input signal SI to the internal signal SoQ can be programmed by varying resistance of the resistors Rtz The resistance of the resistor Rtz can be controlled by the gain controller 38 (FIG. 2).

Figure 7:
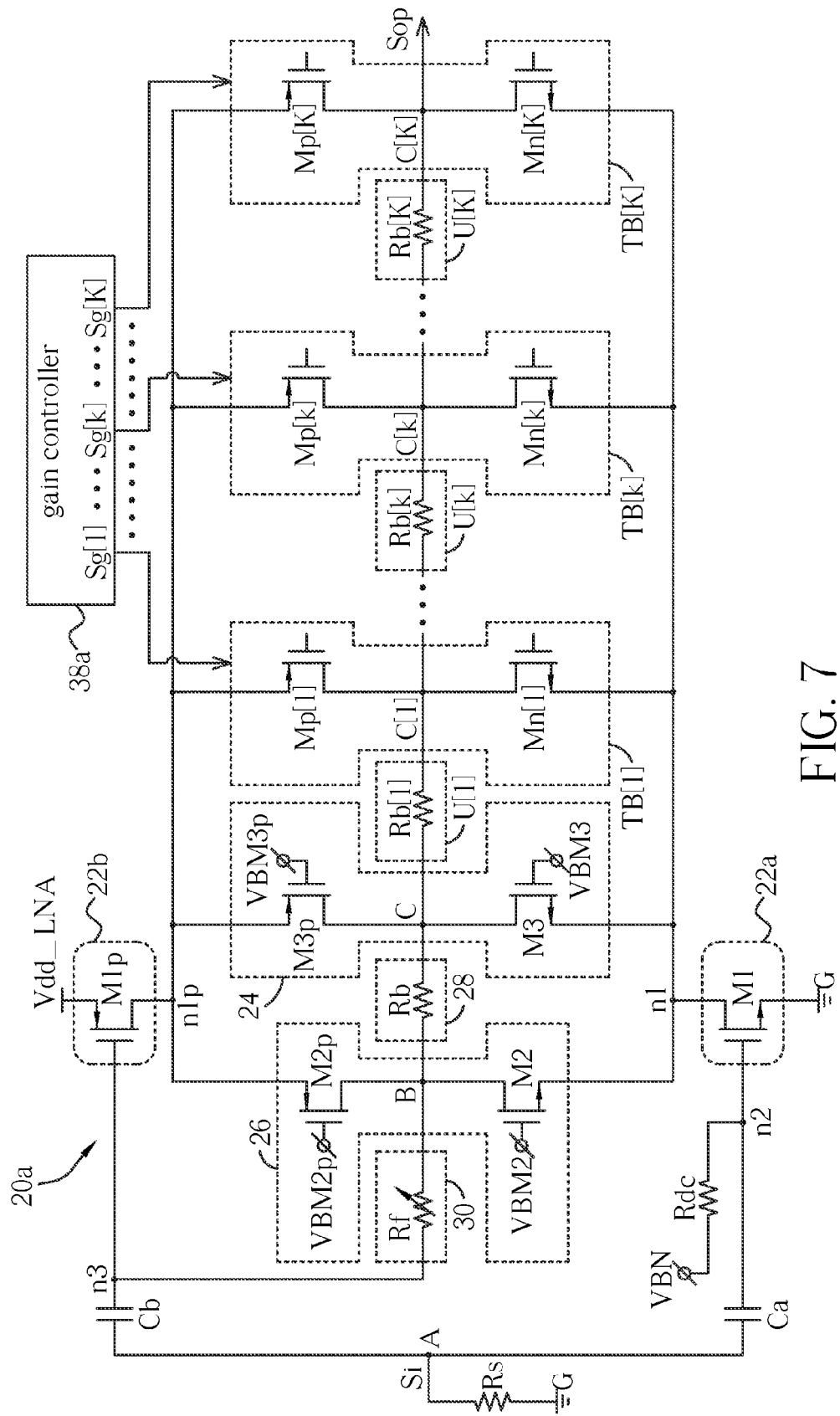
FIG. 7 illustrates an amplifier according to an embodiment of the invention.
Figure 8:
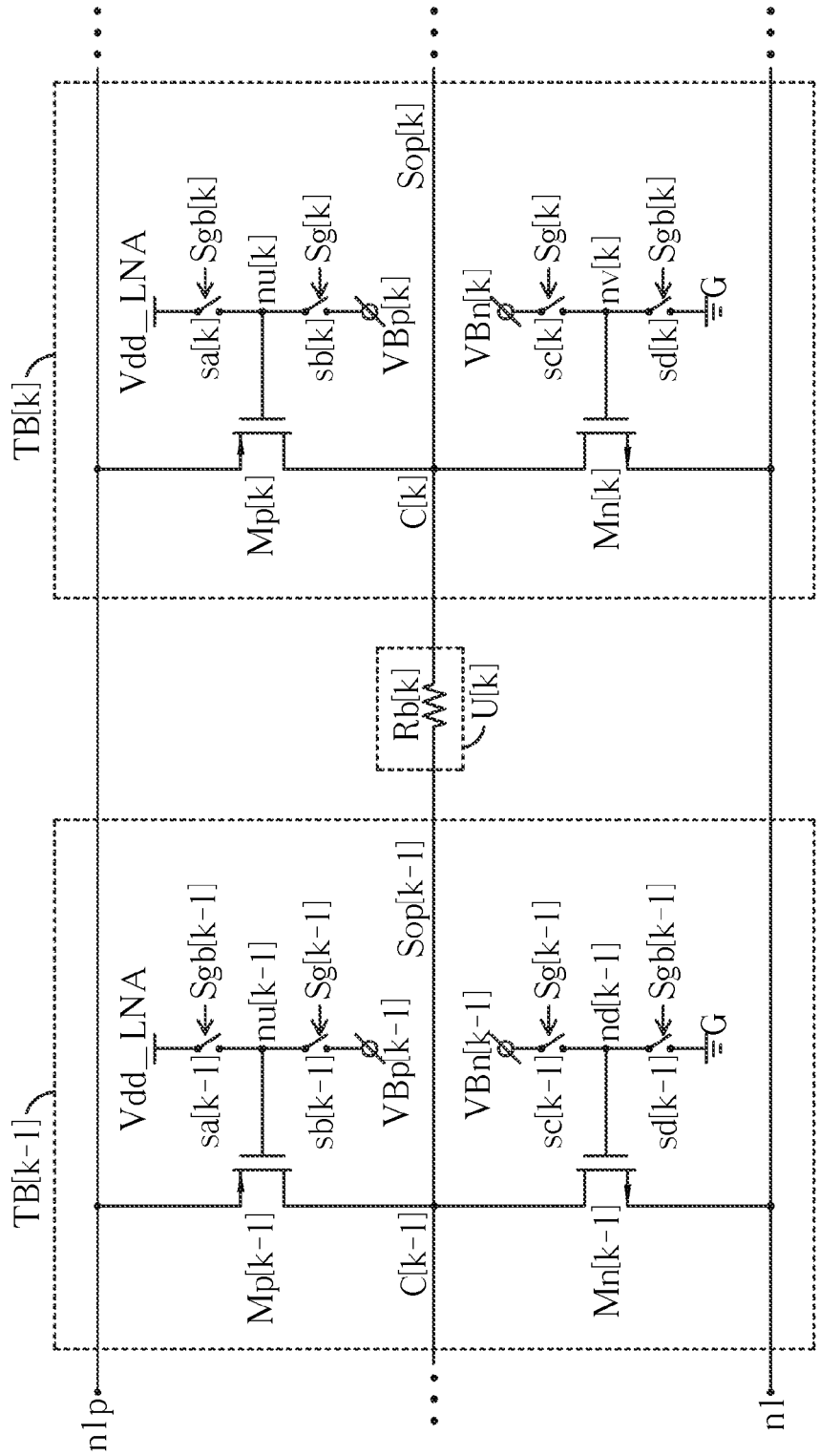
FIG. 8 illustrates a circuit architecture of the tuning branch in FIG. 7 according to an embodiment of the invention.

Please refer to FIG. 7 and FIG. 8. FIG. 7 illustrates an amplifier 20a according to an embodiment of the invention, which is arranged to provide an adjustable gain between the input signal Si and the output signal Sop. The amplifier 20a can be utilized to replace the amplifier 20 of FIG. 1. Similar to the amplifier 20 shown in FIG. 3, the amplifier 20a includes the gain stages 22a and 22b, the main branch 24, the auxiliary branch 26 and the bridge circuit 30. The gain stages 22a and 22b are coupled to the input signal Si at the node A, the main branch 24 is respectively coupled to the gain stages 22a and 22b at the nodes n1 and n1p, and the auxiliary branch 26 is also respectively coupled to the gain stages 22a and 22b at the nodes n1 and n1p. The feedback circuit 30 is coupled between the node B of the auxiliary branch 26 and the node A. In addition to the gain stages 22a and 22b, the main branch 24, the auxiliary branch 26 and the bridge circuit 30, the amplifier 20a further includes a number K of tuning branches TB[1] to TB[K], as well as the same number of corresponding tuning bridge circuits U[1] to U[K]. The number K can be equal to or greater than 1.

The tuning bridges TB[1] to TB[K] have a same circuit architecture, wherein the k-th tuning branch TB[k] (for k=1 to K) is shown in FIG. 8 according to an embodiment of the invention. As shown in FIG. 8, the k-th tuning bridge TB[k] includes two complementary transistors Mp[k] (e.g., a p-channel MOSFET) and Mn[k] (e.g., an n-channel MOSFET), and four switches sa[k], sb[k], sc[k] and sd[k]. A drain, a source and a gate of the transistor Mn[k] are respectively coupled to a node C[k], the node n1 (the splitting node) and a node nv[k]. A drain, a source and a gate of the transistor Mp[k] are respectively coupled to the nodes C[k], n1p and a node nu[k]. The node C[k] can be referred to as a tuning output node of the tuning branch TB[k].

In an embodiment, for k=2 to K, the tuning bridge circuit U[k] is arranged to provide a resistance by a resistor Rb[k] between the nodes C[k−1] and C[k], and the tuning bridge circuit U[1] is arranged to provide a resistance by a resistor Rb[1] between the nodes C and C[1] (FIG. 7). In an embodiment, each of the transistors Mp[1] to Mp[K] is a duplicate of the transistor M3p, and/or each of the transistors Mn[1] to Mn[K] is a duplicate of the transistor M3.

In the tuning branch TB[k], the switch sa[k], which is coupled between the supply voltage Vdd_LNA and the node nu[k], selectively conducts the supply voltage Vdd_LNA to the node nu[k] according to an disable signal Sgb[k]. Also coupled to the node nu[k], the switch sb[k] selectively conducts a bias voltage VBp[k] to the node nu[k] under the control of an enable signal Sg[k], which is complementary to the disable signal Sgb[k]. Similarly, the switch sc[k] and sd[k] selectively conduct the node nv[k] respectively to a bias voltages VBn[k] and the supply voltage G according to the enable signal Sg[k] and the disable signal Sgb[k]. In an embodiment, the bias voltages VBn[k] and VBp[k] are respectively equal to the bias voltages VBM3 and VBM3p, for k=1 to K.

As shown in FIG. 8, for k=2 to K, the tuning bridge circuit U[k] is coupled between the nodes C[k−1] and C[k], and the tuned output signal Sop[k−1] of the tuning branch TB[k−1] is transmitted through the tuning branch circuit U[k] to become the tuned output signal Sop[k] of the tuning branch TB[k]. For k=1, the first tuning bridge circuit U[1] is coupled between the nodes C and C[1] (FIG. 7); and for k=K, the tuned output signal Sop[K] at the node C[K] is outputted as the output signal Sop. That is, the mixers 14I and 14Q (FIG. 1) are arranged to mix the tuned output signal Sop[k] of the tuning branch TB[K] with carrier signals ScI and ScQ to provide the mixed signals SmI and SmQ, respectively.

Through control of the enable signal Sg[k] and the disable signal Sgb[k], the corresponding tuning branch TB[k] can be selectively enabled to provide a tuned output signal Sop[k] at the node C[k] in response to the input signal Si. That is, when the enable signal Sg[k] enables the switches sb[k] and sc[k] to conduct, the switches sa[k] and sd[k] are disabled and stop conducting, so the nodes nu[k] and nv[k] are respectively conducted to the suitable bias voltages VBp[k] and VBn[k], and the tuning branch TB[k] is thus enabled to provide the tuned output signal Sop[k]. While the tuning branch TB[k] is enabled, the complementary transistors Mp[k] and Mn[k] contribute current to the node C[k] in response to the input signal Si, and finally contribute current to the output signal Sop at the terminal node C[K], so an overall trans-conductance from the input signal Si to the output signal Sop is therefore enhanced.

On the other hand, when the disable signal Sgb[k] enables the switches sa[k] and sd[k] to conduct, the switches sb[k] and sc[k] stop conducting, both the transistors Mp[k] and Mn[k] are turned off to disable the tuning branch TB[k], thus both the transistors Mp[k] and Mn[k] do not contribute current to the node C[k] in response to the input signal Si. The enable signals Sg[1] to Sg[K], as well as the complementary disable signals Sgb[1] to Sgb[K], can be provided by a gain controller 38a.

To adjust the gain from the input signal Si to the output signal Sop, number of enabled tuning branches is changed. For a highest gain, all the tuning branches are enabled. For a lower gain, some of the tuning branches are disabled; as more tuning branches are disabled, the gain becomes lower. To maintain input matching at the node A while the tuning branches TB[1] to TB[K] are selectively enabled, a variable resistor Rf is arranged to provide a variable resistance in the feedback circuit 30. As number of enabled tuning branches is varied, resistance of the resistor Rf is adjusted accordingly by the gain controller 38a, such that input matching at the node A can be kept unaffected. For example, resistance of the resistor Rf is increased as more tuning branches are enabled.

Figure 9:
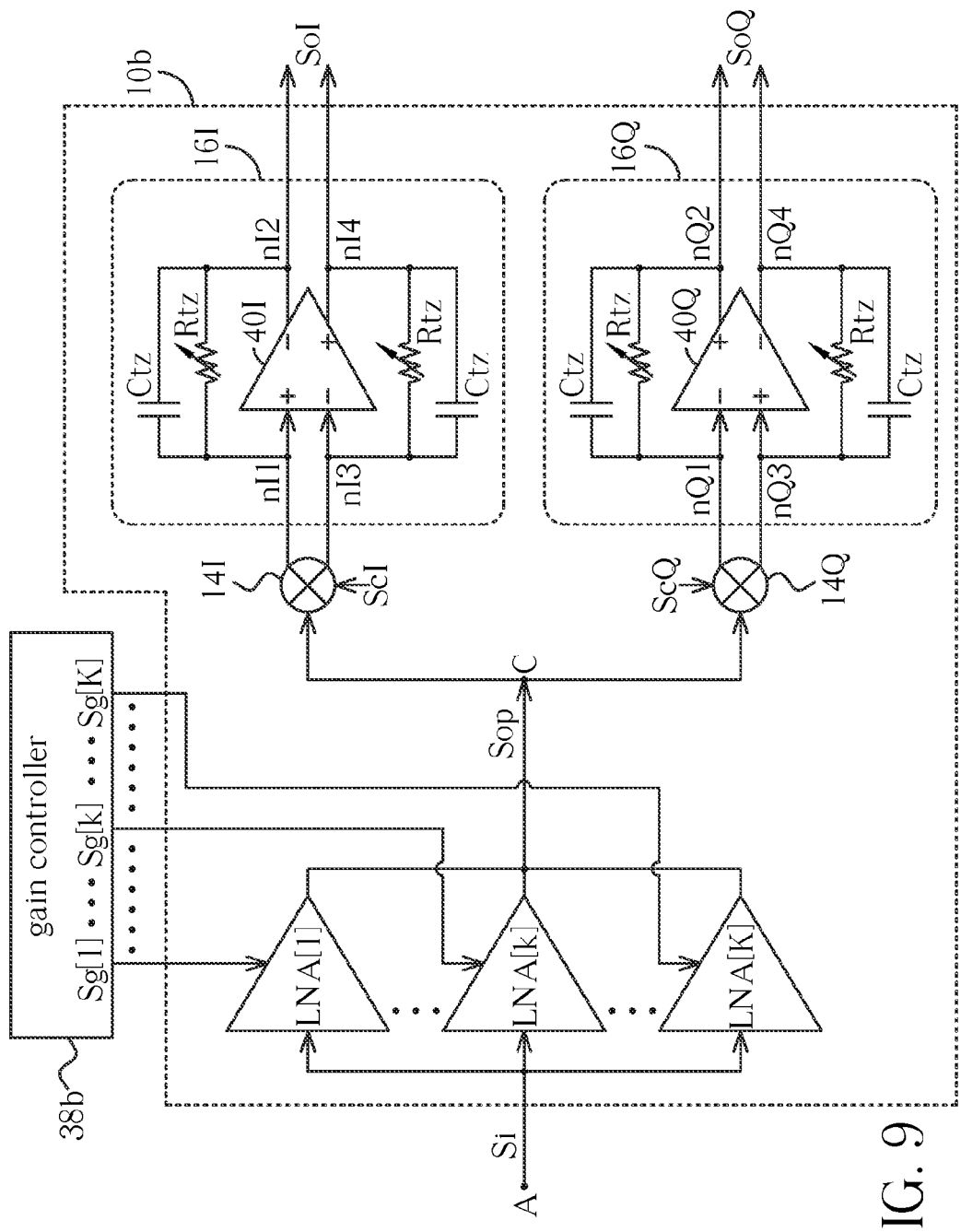
FIG. 9 illustrates a receiver according to an embodiment of the invention.
Figure 10:
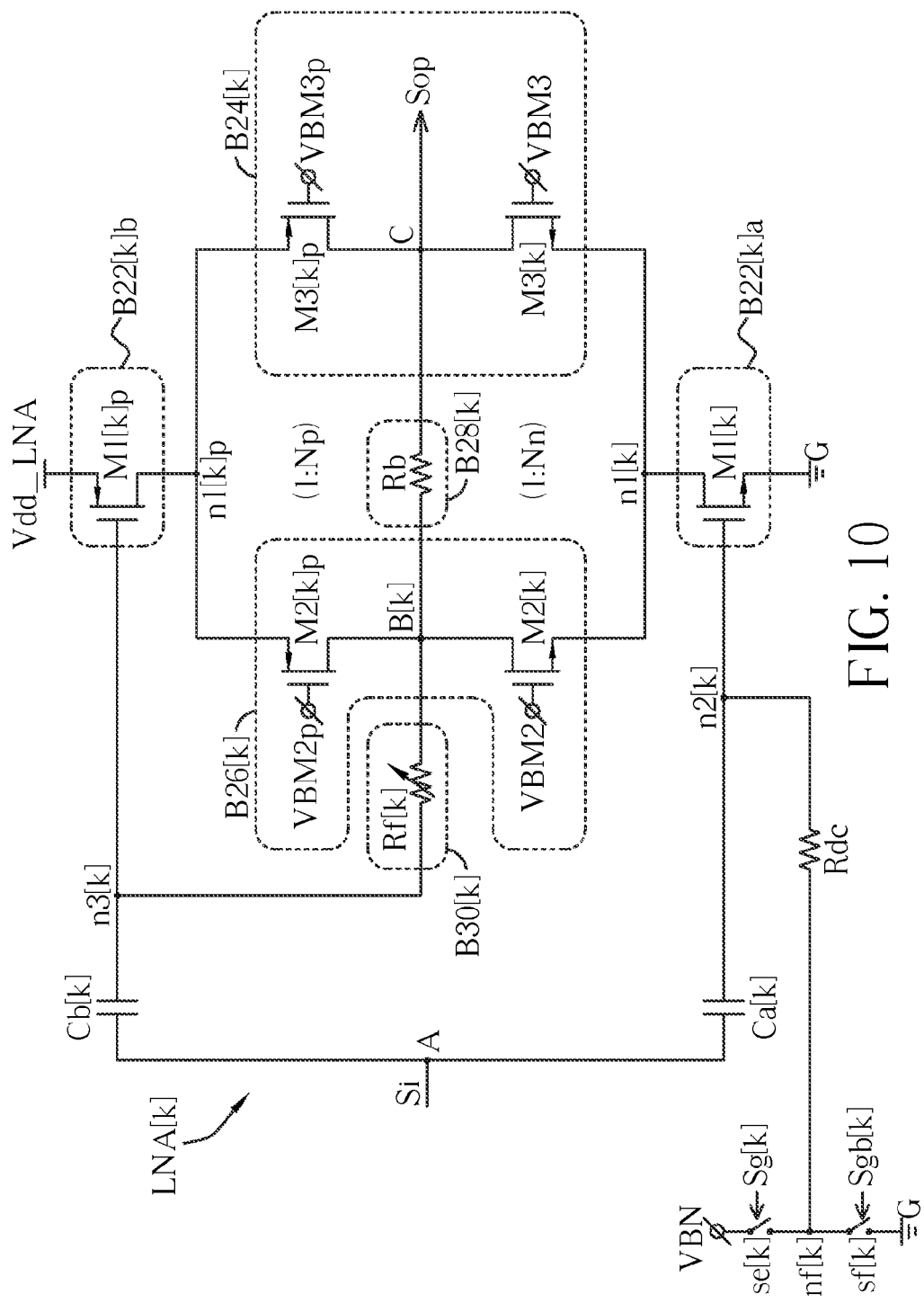
FIG. 10 illustrates a circuit architecture of the amplifier in FIG. 9 according to an embodiment of the invention.

Please refer to FIG. 9 and FIG. 10; FIG. 9 illustrates a receiver 10b according to an embodiment of the invention. The receiver 10b, in cooperation with a gain controller 38b, includes a number K of amplifiers LNA[1] to LNA[K], mixers 14I and 14Q, and secondary amplifiers 16I and 16Q. The number K can be set to be larger than 1. The input nodes of the amplifiers LNA[1] to LNA[K] are commonly coupled together to the node A, and the output nodes of the amplifiers LNA[1] to LNA[K] are commonly coupled together to the node C. Each of the amplifiers LNA[1] to LNA[K] can be selectively enabled and disabled; enabled amplifier(s) can contribute current, in response to the input signal Si, to the signal Sop at the node C, therefore an overall trans-conductance from voltage of the input signal Si to current of the output signal Sop can be adjusted by changing number of the enabled amplifiers LNA[k]. The gain controller 38b is arranged to provide enable signals Sg[1] to Sg[K] respectively for the amplifiers LNA[1] to LNA[K].

Similar to FIG. 1, in the embodiment of FIG. 9, the mixers 14I and 14Q are coupled to the node C which implements current mode interfaces between the amplifiers LNA[k] and the mixers 14I/14Q. The secondary amplifiers 16I and 16Q are respectively coupled to the mixers 14I and 14Q through current mode interfaces of the nodes nI1, nI3, nQ1 and nQ3, and are arranged to provide the internal signals SoI and SoQ, amplified in response to the mixed signals SmI and SmQ, at the output ports of the amplifiers cores 40I and 40Q, respectively. Thus, the internal signal SoI and SoQ can be further processed to retrieve information carried in the signal Si.

In an embodiment, each of the amplifiers LNA[1] to LNA[K] is of a same circuit architecture, as the k-th amplifier LNA[k] is shown in FIG. 10 according to an embodiment of the invention. Similar to the amplifier 20 of FIG. 3, the amplifier LNA[k] of FIG. 10 includes two capacitors Ca[k] and Cb[k], two gain stages B22[k]a and B22[k]b, a main branch B24[k], an auxiliary branch B26[k], a bridge circuit B28[k] and a feedback circuit B30[k] respectively analogous to the gain stages 22a and 22b, the main branch 24, the auxiliary branch 26, the bridge circuit 28 and the feedback circuit 30.

The gain stages B22[k]a and B22[k]b receive the input signals Si of the common input node A at nodes n2[k] and n3[k] through the capacitors Ca[k] and Cb[k], and are coupled to nodes n1[k] and n1p[k], respectively. The main branch B24[k], which includes a pair of complementary transistors M3[k] and M3[k]p, is coupled between the nodes n1[k] and n1[k]p. The bridge circuit B28[k], arranged to provide a resistance by a resistor Rb, is coupled between the common output node C and a node B[k] of the amplifier LNA[k]. The auxiliary branch B26[k], including a pair of complementary transistors M2[k] and M2[k]p, is coupled between the nodes n1[k] and n1[k]p. The feedback circuit B30[k], arranged to provide a variable resistance by a resistor Rf[k], is coupled between the node B[k] and the node A.

In addition, the amplifier LNA[k] further includes two switches se[k] and sf[k] and a resistor Rdc. The switch se[k], which is controlled by the enable signal Sg[k], is coupled between the bias voltage VBN and a node nf[k]; the switch sf[k], controlled by a disable signal Sgb[k] complementary to the enable signal Sg[k], is coupled between the node nf[k] and the supply voltage G. For different amplifiers LNA[k1] and LNA[k2] (k1 not equal to k2), the nodes n2[k1] and n2[k2] are isolated, the nodes n3[k1] and n3[k2] are isolated, the nodes n1[k1] and n1[k2] are isolated; also, the nodes n1[k1]p and n1[k2]p, the nodes B[k1] and B[k2], and the nodes nf[k1] and nf[k2] are isolated.

To enable the amplifier LNA[k], the switch Sg[k] is enabled to conduct the node nf[k] to the bias voltage VBN under control of the enable signal Sg[k], and the switch Sf[k] is off to be open between the node nf[k] and the supply voltage G. Therefore, with functionality and operations similar to the amplifier 20 of FIG. 3, the amplifier LNA[k] is well biased to contribute current to the output signal Sop at the node C in response to the input signal Si. On the other hand, while the amplifier LNA[k] is disabled, the switch Sg[k] is off under control of the enable signal Sg[k], and the switch Sf[k] is enabled by the disable signal Sgb[k] to conduct between the node nf[k] and the supply voltage G. In this way, the transistor M1[k] of the amplifier LNA[k] is turned off, and the amplifier LNA[k] does not contribute current to the output signal Sop at the node C in response to the input signal Si.

As more of the amplifiers LNA[1] to LNA[K] are enabled, an overall trans-conductance from voltage of the input signal Si to current of the output signal Sop increases. The resistance provided by the feedback circuit B30[k] can be adjusted in response to number of enabled amplifiers LNA[k], such that input matching at the node A can be maintained.

To sum up, the LNA and receiver of the embodiments of the invention provide a current mode interface with the main branch of low voltage gain, and provide suitable input matching by cooperation of the feedback circuit and the auxiliary branch of high voltage gain. While source degenerated inductor may be adopted for input matching, source degenerated inductor occupies large layout area, and is vulnerable to magnetically coupled noise. In contrast, the LNA and receiver of the embodiments can eliminate use of source degenerated inductor.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An amplifier receiving an input signal and providing an output signal in response, comprising:
   a gain stage comprising an input node and a splitting node, wherein the input node is coupled to the input signal;
   a main branch comprising a first node and an output node of current mode, the first node being coupled to the splitting node, and the main branch arranged to output the output signal at the output node;
   an auxiliary branch comprising a second node and a feedback node, the second node being coupled to the splitting node; and
   a feedback circuit coupled between the feedback node and the input node;
   wherein the main branch is arranged to provide an output impedance at the output node and conduct a current with a load impedance, and the output impedance is greater than the load impedance.

2. The amplifier as claimed in claim 1, wherein a voltage swing at the output node is less than a voltage swing at the feedback node.

3. The amplifier as claimed in claim 1, wherein a voltage gain from the input node to the output node is lower than a voltage gain from the input node to the feedback node.

4. The amplifier as claimed in claim 1, wherein the auxiliary branch is arranged to provide a voltage fluctuation at the input node in response to a first current fluctuation to the splitting node, and the gain stage is arranged to drive a second current fluctuation to the splitting node in response to the voltage fluctuation, and the second current fluctuation is out-of-phase with the first current fluctuation.

5. The amplifier as claimed in claim 1 further comprising:
   a bridge circuit coupled between the output node and the feedback node for blocking an AC signal at the feedback node away from the output node, and coupling a DC bias at the feedback node to the output node.

6. The amplifier as claimed in claim 5, wherein the bridge circuit is arranged to provide a first resistance between the feedback node and the output node, the feedback circuit is arranged to provide a second resistance between the input node and the feedback node, and the first resistance is greater than the second resistance.

7. The amplifier as claimed in claim 1, wherein the gain stage comprises a first transistor with a first gate, a first drain and a first source respectively coupled to the input node, the splitting node and a supply voltage, the auxiliary branch comprises a second transistor with a second gate, a second drain and a second source respectively coupled to a second bias voltage, the feedback node and the second node; and the main branch comprises a third transistor with a third gate, a third drain and a third source respectively coupled to a first bias voltage, the output node and the splitting node.

8. The amplifier as claimed in claim 7, wherein an aspect ratio of the third transistor is greater than an aspect ratio of the second transistor.

9. The amplifier as claimed in claim 7, wherein the first bias voltage and the second bias voltage are in association with a current dependent on temperature.

10. The amplifier as claimed in claim 1, further comprising:
    a first predetermined number of tuning branches, each of the tuning branches comprising a third node and a tuning output node of current mode, the third node being coupled to the splitting mode, and each of the tuning branches being selectively enabled to provide a tuned output signal at the corresponding tuning output node in response to the input signal.

11. The amplifier as claimed in claim 10 further comprising:
   a second predetermined number of tuning bridge circuits, each tuning bridge circuit coupled between two tuning output nodes of the corresponding tuning branches.

12. The amplifier as claimed in claim 10, wherein the feedback circuit is arranged to provide a resistance between the feedback node and the input node, and the resistance is variable in response to a number of the enabled tuning branches.

13. A receiver comprising:
   an amplifier for receiving an input signal with an input node and providing an output signal in response, and comprising:
   a main branch comprising an output node of current mode, and arranged to output the output signal at the output node; and
   an auxiliary branch coupled to the input node for input matching of the input node, wherein the main branch and the auxiliary branch are further coupled to a splitting node, the main branch is arranged to provide an output impedance at the output node and conduct a current with a load impedance, and the output impedance is greater than the load impedance; and
   a mixer coupled to the amplifier, and arranged to mix the output signal with a carrier signal to provide a mixed signal; and
   a secondary amplifier coupled to the mixer through a current mode interface, and arranged to provide an internal signal in response to the mixed signal.

14. The receiver as claimed in claim 13, wherein the auxiliary branch comprises a feedback node, and the amplifier further comprises:
   a gain stage comprising a first transistor with a first gate, a first drain and a first source respectively coupled to the input node, the splitting node and a supply voltage; and
   a feedback circuit coupled between the auxiliary branch and the input node.

15. The receiver as claimed in claim 13, wherein the main branch and the auxiliary branch respectively operate according to a first bias voltage and a second bias voltage; and the receiver further comprising:
   a bias circuit arranged to provide the first bias voltage and the second bias voltage in response to a current dependent on temperature.

16. The receiver as claimed in claim 13, wherein the amplifier further comprises:
   a first predetermined number of tuning branches, each of the tuning branches comprising a third node and a tuning output node of current mode, the third node being coupled to the splitting mode, and each of the tuning branches being selectively enabled to provide a tuned output signal at the corresponding tuning output node in response to the input signal,
   wherein the mixer is arranged to mix the tuned output signal of one of the tuning bridges with a carrier signal to provide the mixed signal.

17. The receiver as claimed in claim 16, wherein the amplifier further comprises:
   a second predetermined number of tuning bridge circuits, each tuning bridge circuit coupled between two tuning output nodes of the corresponding tuning branches.

18. The receiver as claimed in claim 16, wherein the feedback circuit is arranged to provide a resistance between the feedback node and the input node, and the resistance is variable in response to a number of the enabled tuning branches.

19. The receiver as claimed in claim 13 comprising a plurality of amplifiers; the input nodes of the amplifiers commonly coupled together, and the output nodes of the amplifiers commonly coupled together; wherein each of the amplifiers can be selectively enabled and disabled.

20. The receiver as claimed in claim 19, wherein the feedback circuit of each of the amplifiers is arranged to provide a resistance between the feedback node and the input node, and the resistance is variable in response to a number of enabled amplifiers.

21. The receiver as claimed in claim 13, wherein the secondary amplifier comprising a variable resistor coupled between a node of the current mode interface and a node providing the internal signal for adjusting a gain between the input signal and the internal signal.

* * * * *